(12) United States Patent
Puckett et al.

(10) Patent No.: US 11,119,163 B2
(45) Date of Patent: Sep. 14, 2021

(54) QUANTUM VECTOR MAGNETOMETER BASED ON NANOSCALE FIN WAVEGUIDE

(71) Applicant: Honeywell International Inc., Morris Plains, NJ (US)

(72) Inventors: Matthew Wade Puckett, Phoenix, AZ (US); Neal Eldrich Solmeyer, Edina, MN (US); Steven Tin, Edina, MN (US); Robert Compton, Loretto, MN (US)

(73) Assignee: Honeywell International Inc., Charlotte, NC (US)

( * ) Notice: Subject to any disclaimer, the term of this patent is extended or adjusted under 35 U.S.C. 154(b) by 12 days.

(21) Appl. No.: 16/786,495

(22) Filed: Feb. 10, 2020

(65) Prior Publication Data

US 2021/0132163 A1    May 6, 2021

Related U.S. Application Data

(60) Provisional application No. 62/928,157, filed on Oct. 30, 2019.

(51) Int. Cl.
*G01R 33/26* (2006.01)
*G02B 6/26* (2006.01)

(52) U.S. Cl.
CPC ............... *G01R 33/26* (2013.01); *G02B 6/26* (2013.01)

(58) Field of Classification Search
CPC .... G01R 33/032; G01R 33/323; G01R 33/26; G02B 6/26
See application file for complete search history.

(56) References Cited

U.S. PATENT DOCUMENTS 9,910,105 B2   3/2018   Boesch et al.
10,317,279 B2  6/2019   Bruce et al.
10,330,744 B2  6/2019   Luzod
(Continued)

FOREIGN PATENT DOCUMENTS

WO   2019002576 A1   1/2019

OTHER PUBLICATIONS

Bougas et al., "On the Possibility of Miniature Diamond-Based Magnetometers Using Waveguide Geometries", Micromachines, Jun. 1, 2018, pp. 1-11, MDPI.
(Continued)

*Primary Examiner* — Jay Patidar
(74) *Attorney, Agent, or Firm* — Fogg & Powers LLC

(57) ABSTRACT

A device includes a substrate and nanoscale fin formed from a first material, a RF emitter that emits energy in a range of radio frequencies, and a waveguide formed from a second material. The device further includes a bichromatic directional coupler configured to couple pump and probe laser light into the waveguide. The waveguide is positioned proximate to the nanoscale fin along a coupling length such that the pump laser light propagating within the waveguide is coupled into the nanoscale fin from evanescent wave overlap along the coupling length. The pump laser light causes the first material to absorb the probe laser light when energy emitted by the RF emitter is at one or more frequencies dependent on a magnetic field. The device further includes a processor configured to determine a magnetic field strength of the magnetic field based on an identification of the one or more frequencies.

20 Claims, 9 Drawing Sheets

(56) References Cited

U.S. PATENT DOCUMENTS

| | | | | |
|---|---|---|---|---|
| 10,901,054 | B1* | 1/2021 | Chen | G01R 33/3607 |
| 2014/0354275 | A1* | 12/2014 | Sheng | G01R 33/26 |
| | | | | 324/244.1 |
| 2016/0231394 | A1 | 8/2016 | Manickam et al. | |
| 2017/0023487 | A1* | 1/2017 | Boesch | G01N 21/55 |
| 2017/0343621 | A1 | 11/2017 | Hahn et al. | |
| 2018/0275210 | A1* | 9/2018 | Luzod | G02B 6/0045 |
| 2019/0018076 | A1 | 1/2019 | Hahn et al. | |
| 2019/0219645 | A1 | 7/2019 | Hahn et al. | |
| 2021/0103166 | A1 | 4/2021 | Puckett et al. | |

OTHER PUBLICATIONS

Jensen et al., "Cavity-Enhanced Room-Temperature Magnetometry Using Absorption by Nitrogen-Vacancy Centers in Diamond", Physical Review Letters 112, Apr. 23, 2014, pp. (160802-1)-(160802-5), American Physical Society.

U.S. Patent and Trademark Office, "Office Action", U.S. Appl. No. 16/788,819, dated Apr. 13, 2021, pp. 1 through 10, Published: US.

* cited by examiner

QUANTUM VECTOR MAGNETOMETER BASED ON NANOSCALE FIN WAVEGUIDE

CROSS-REFERENCE TO RELATED APPLICATION

This application claims the benefit of U.S. Provisional Application Ser. No. 62/928,157, filed Oct. 30, 2019, and titled "QUANTUM VECTOR MAGNETOMETER BASED ON NANOSCALE FIN WAVEGUIDE," which is hereby incorporated herein by reference.

This application is related to U.S. Provisional Application Ser. No. 62/912,533, filed Oct. 8, 2019, and titled "INTEGRATED PHOTONICS QUANTUM VECTOR MAGNETOMETER" (hereinafter "the '533 application"), which is hereby incorporated herein by reference.

BACKGROUND

Many applications use precise measurements of magnetic fields. In particular, applications attempt to measure vector magnetic field information to provide desired functionality within a system. For example, applications may measure magnetic fields in anomaly-based navigation and in dipole beacon-based navigation. These applications typically require magnetic sensors with high sensitivity; low size, weight, and power; and the ability to operate in an earth field. Some technologies (for example, superconducting quantum interference device (SQUID) or atomic based magnetometry) are capable of providing high sensitivity that is useful in certain applications. However, some of these technologies have drawbacks. For example, SQUID uses cryogenic refrigeration, which adds to the size and power consumption of the magnetometer, and atomic based magnetometers are unable to operate in an earth field. Further, the aforementioned technologies use at least three sensors to provide vector information.

SUMMARY

In one example, a device includes a substrate and a nanoscale fin formed from a first material, a radio frequency emitter that emits energy in a range of radio frequencies, and a waveguide formed from a second material, wherein the waveguide is positioned on the nanoscale fin. The device further includes a bichromatic directional coupler configured to couple pump laser light and probe laser light into the waveguide. The waveguide is positioned proximate to the nanoscale fin along a coupling length such that the pump laser light propagating within the waveguide is coupled into the nanoscale fin from evanescent wave overlap along the coupling length. The pump laser light causes the first material to absorb the probe laser light when the energy emitted by the radio frequency emitter is at one or more frequencies that depend on a magnetic field. The device further includes a processor configured to determine a magnetic field strength of the magnetic field based on an identification of the one or more frequencies that depend on the magnetic field.

DRAWINGS

Understanding that the drawings depict only some embodiments and are not therefore to be considered limiting in scope, the exemplary embodiments will be described with additional specificity and detail using the accompanying drawings, in which.

In accordance with common practice, the various described features are not drawn to scale but are drawn to emphasize specific features relevant to the example embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made.

Systems and methods for an integrated photonics quantum vector magnetometer are provided herein. In some examples, the magnetometer includes a waveguide structure including a waveguide positioned on a nanoscale fin formed from a wafer. Light from a pump laser is coupled into the waveguide and the pump laser light is coupled into the nanoscale fin along the length through which the waveguide and the nanoscale fin are proximate one another. Further, light from a probe laser is coupled into the waveguide and the pump laser light is coupled into the nanoscale fin in the presence of a microwave signal. The probe laser light is absorbed by the material of the nanoscale fin at a particular frequency of the microwave signal and depending on the frequency or frequencies at which the probe laser light is absorbed, the magnetic vectors can be determined. The waveguide structure and system described herein can be fabricated on a bulk wafer rather than requiring the more difficult thin film techniques described in the '533 application.

Figure 1:
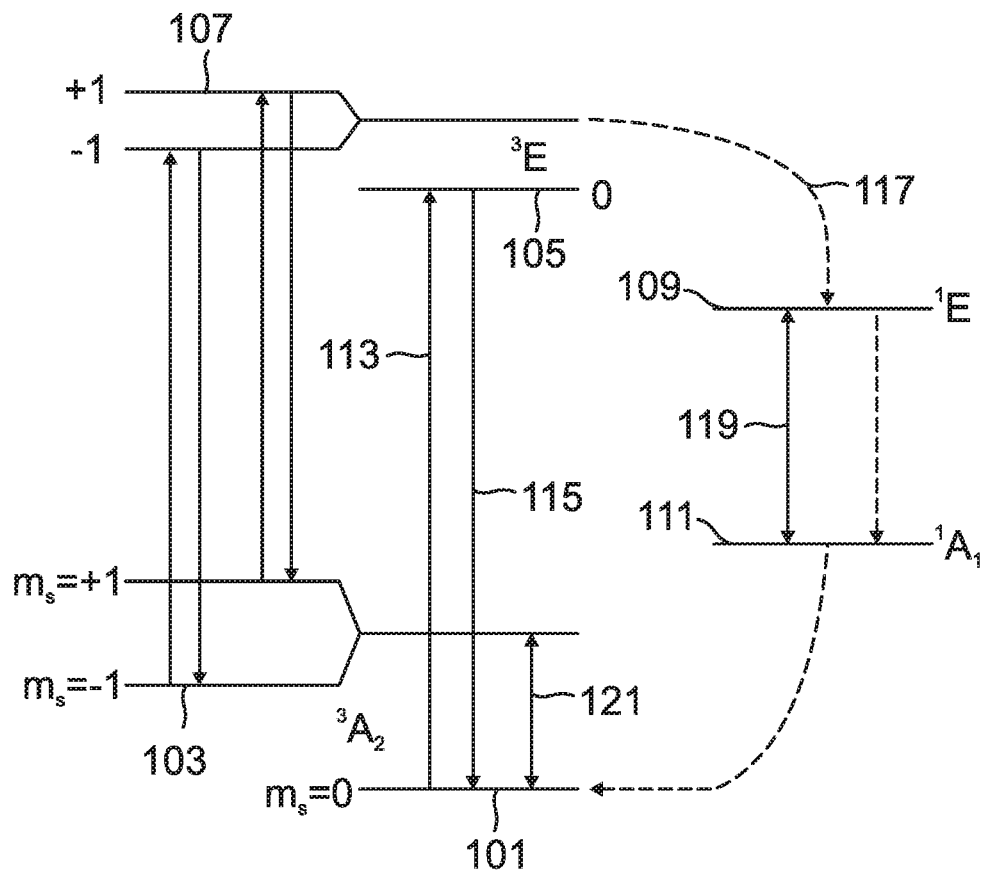
FIG. 1 is a diagram illustrating transitions between the various states of a particular material used for fabricating a magnetometer.

FIG. 1 is a diagram illustrating transitions between the various states of a particular material used for fabricating a magnetometer. For example, some materials may have certain physical characteristics that allow the material to be responsive to magnetic fields. For example, a first material may be nitrogen vacancy (NV) diamond, silicon carbide with defect centers, or other material having similar physical characteristics. As used herein, NV diamond may refer to a diamond material having multiple point defects where a point defect includes a nearest-neighbor pair of a nitrogen atom substituted for a carbon atom and a lattice vacancy.

As illustrated, the first material may have a ground state that is a spin triplet state. In particular, the ground state may have multiple spin projections: a ground antiparallel 101 of spin projection 0 and ground parallel spins 103 with spin projections of +/−1, where the ground antiparallel spins 101 and the ground parallel spins 103 are separated by a resonant frequency 121. For example, in the absence of a magnetic field, when the first material is NV diamond, the resonant frequency may be equal to 2.87 GHz. Additionally, the point defects within the first material may be optically excited through spin conserving transitions to a spin triplet excited level, where the triplet excited level also has multiple spin projections: an excited antiparallel spin 105 of spin projection 0 and excited parallel spins 107 with spin projections of +/−1. To optically excite the point defects, the first material may be exposed to a pump light having a particular frequency. For example, in NV diamond, laser light having a wavelength of 532 nm may cause spin conserving transitions from the ground triplet state to the excited triplet states.

When the point defects within the first material are at the excited state, the defects may relax either through a radiative transition 115 or through an intersystem crossing 117. When the point defect relaxes through a radiative transition 115, the point defects may fluoresce and return to the ground triplet states. For example, NV diamond point defects may emit light having a wavelength of 637 nm during radiative transitions 115. When the point defect relaxes through an intersystem crossing 117, the point defect will not fluoresce and will transition to a shelved state, where the shelved state may be a shelved ground state 111 or a shelved excited state 109. Additionally, when the point defects are in one of the shelved states 109 and 111, the point defects may absorb probe laser light 119 having a particular frequency. For example, NV diamond point defects in the shelved states 109 and 111 may absorb probe laser light 119 having a wavelength of 1042 nm.

In some examples, a microwave frequency may be applied to the first material to increase the rate of intersystem crossings 117 as compared to radiative transitions 115. In the first material, non-radiative intersystem crossings 117 may be strongly spin selective. For example, point defects having a parallel spin 107 are more likely to experience an intersystem crossing 117 to the shelved states 109 and 111. In contrast, point defects having the excited antiparallel spin 105 are more likely to experience a radiative transition back to the ground triplet state. To increase the probability of intersystem crossings, a microwave frequency may be applied to the first material that is equal to the resonant frequency for the first material. For example, when the first material is NV diamond, the resonant frequency may be 2.87 GHz. Accordingly, applying a radio frequency of 2.87 GHz to the first material may increase the probability of intersystem crossings 117 to the shelved states 109 and 111.

Additionally, when a microwave signal at the resonant frequency is applied to the first material, the probe laser light 119 is more likely to be absorbed by the first material as the population of point defects at the shelved states 109 and 111 within the first material is greater than when the first material is not exposed to the RF energy at the resonant frequency. Accordingly, when the probe laser light 119 is applied to the first material in the absence of the microwave signal at the resonant frequency, the probe laser light 119 is absorbed by the first material with less frequency. For example, when NV diamond material is exposed to a microwave signal having a resident frequency of 2.87 GHz, the NV diamond material may begin to absorb probe laser light 119 having a wavelength of 1042 nm at an increased rate.

In some examples, the resonant frequency for the first material may change in the presence of a magnetic field. For example, when the first material is exposed to a magnetic field, the Zeeman effect may cause the resonant frequency to experience a shift in proportion to the strength of the experienced magnetic field. In particular, in the presence of a magnetic field the resonance frequency may split into two different resonant frequencies, where the difference between the two resonant frequencies is proportional to the experienced magnetic field. Accordingly, the resonant frequency at which a probe laser light 119 is absorbed by point defects in the first material may be monitored to determine the strength of a magnetic field experienced by the first material.

Additionally, the point defects within the first material may be in one of multiple different orientations. For example, when the first material is NV diamond, each point defect may be in one of four different orientations. Additionally, the first material may have many point defects in each of the four different orientations. Accordingly, vector information for a magnetic field may be extracted from the first material when a probe laser light 119 is applied to the first material. For example, when the first material is exposed to a magnetic field, the resonant frequencies for a point defect may shift based on the orientation of the point defect in relation to the experienced magnetic field. Thus, when the point defects in the first material are in multiple different orientations, the point defects in the first material may have separate resonant frequencies associated with each of the different orientations of the point defects. Therefore, vector information for the magnetic field may be determined by identifying which resonances correspond to the different orientations of the point defects in the first material. In some examples, biased magnetic fields may be applied to the first material to aid in determining which resonance frequencies are associated with particular orientations of the point defects.

In examples described herein, the first material may be incorporated within a magnetometer that exposes the first material to a pump light 113 to cause the point defects within the first material to move to the excited triplet state. The magnetometer may also expose the first material to RF energy in a range of frequencies that includes the resonant frequency 121 for the first material, where a probability of intersystem crossings 117 to shelved states 109 and 111 increases at the resonant frequency 121 as described above. Additionally, the first material may be exposed to a probe laser light 119, where the probe laser light 119 is absorbed by point defects in the shelved states 109 and 111. Accordingly, an applied microwave signal may be swept through a range of frequencies to identify the resonant frequencies associated with the different orientations of the point defects within the first material. The resonant frequencies may be identified when the intensity of the applied probe laser light 119 that passes through the first material decreases, indicating that the applied probe laser light 119 was absorbed by the point defects within the first material. Based on the identified resonant frequencies, a magnetic field experienced by the first material may be calculated with high sensitivity to magnetic field changes; low size, weight, and power; and a robustness that could enable the use of a resulting magnetometer in many magnetic based/aided applications such as in navigation.

Figure 2:
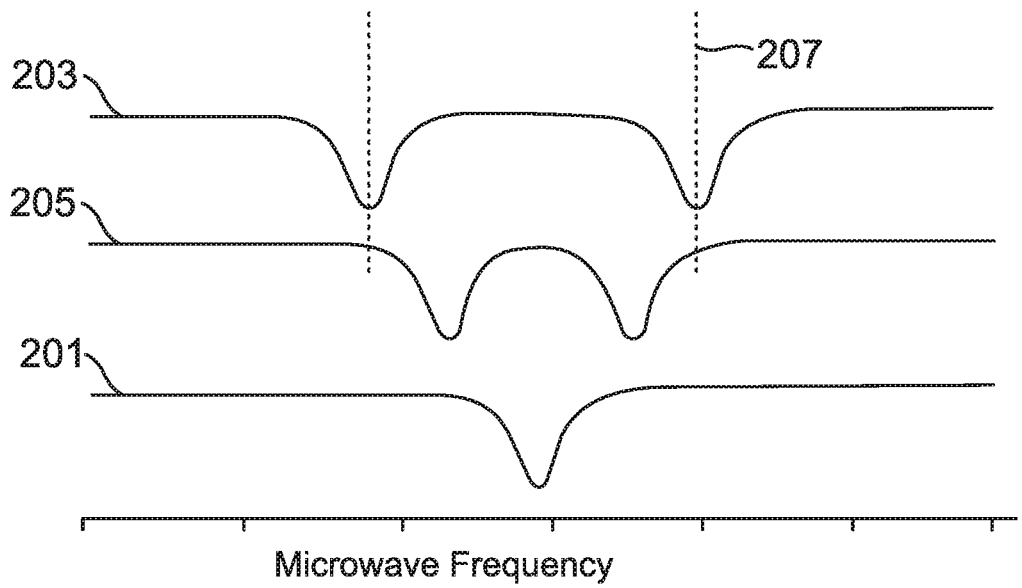
FIG. 2 is a graph illustrating the detection of a magnetic field based on the identification of resonance lines in an applied microwave field.

FIG. 2 is a graph illustrating the detection of a magnetic field based on the identification of resonance lines in an applied microwave field that is swept through a range of frequencies. As described above, a first material may be exposed to a range of microwave frequencies, where the range of applied frequencies includes the different resonant frequencies for the first material. Additionally, the different resonant frequencies are associated with the strength of the magnetic fields experienced by the first material. Further, the first material may have different resonant frequencies associated with the different orientations of point defects within the first material.

As illustrated, FIG. 2 shows various graphs of the intensity of a probe laser as emitted from the first material at different microwave frequencies applied to the first material for three different magnetic field strengths. For example, graph 201 shows the intensity of the emitted probe laser at different frequencies when the first material is not exposed to a magnetic field. When light from a probe laser is coupled into a first material in the absence of an applied magnetic field, the first material may not experience a Zeeman shift and the probe laser light may be absorbed at the single resonant frequency for the first material. Accordingly, the intensity of the light 201 may decrease at the single resonant frequency for the first material.

Additionally, when the first material is exposed to different magnetic field strengths, the resonant frequency may experience a frequency shift in proportion to the experienced magnetic field strength. For example, graph 205 and graph 203 illustrate an intensity of the emitted probe laser light by the first material in the presence of different magnetic field strengths. For example, the magnetic field strength experienced by the first material associated with the graph 203 is greater that the magnetic field strength experienced by the first material associated with the graph 205. Accordingly, the magnitude of the shift of the resonant frequencies is greater when the first material is exposed to a greater magnetic field strength. To identify the magnitude of the shift of the resonant frequency, a system may identify the frequencies 207 associated with decreases in the intensity of the probe laser light emitted by the first material. Based on the magnitude of the shift of the resonant frequency, a system may determine the magnetic field experienced by a point defect. Additionally, when there are multiple resonant frequencies, the system may identify the orientations of the point defects associated with the different resonant frequencies and the direction of the experienced magnetic field.

Figure 3:
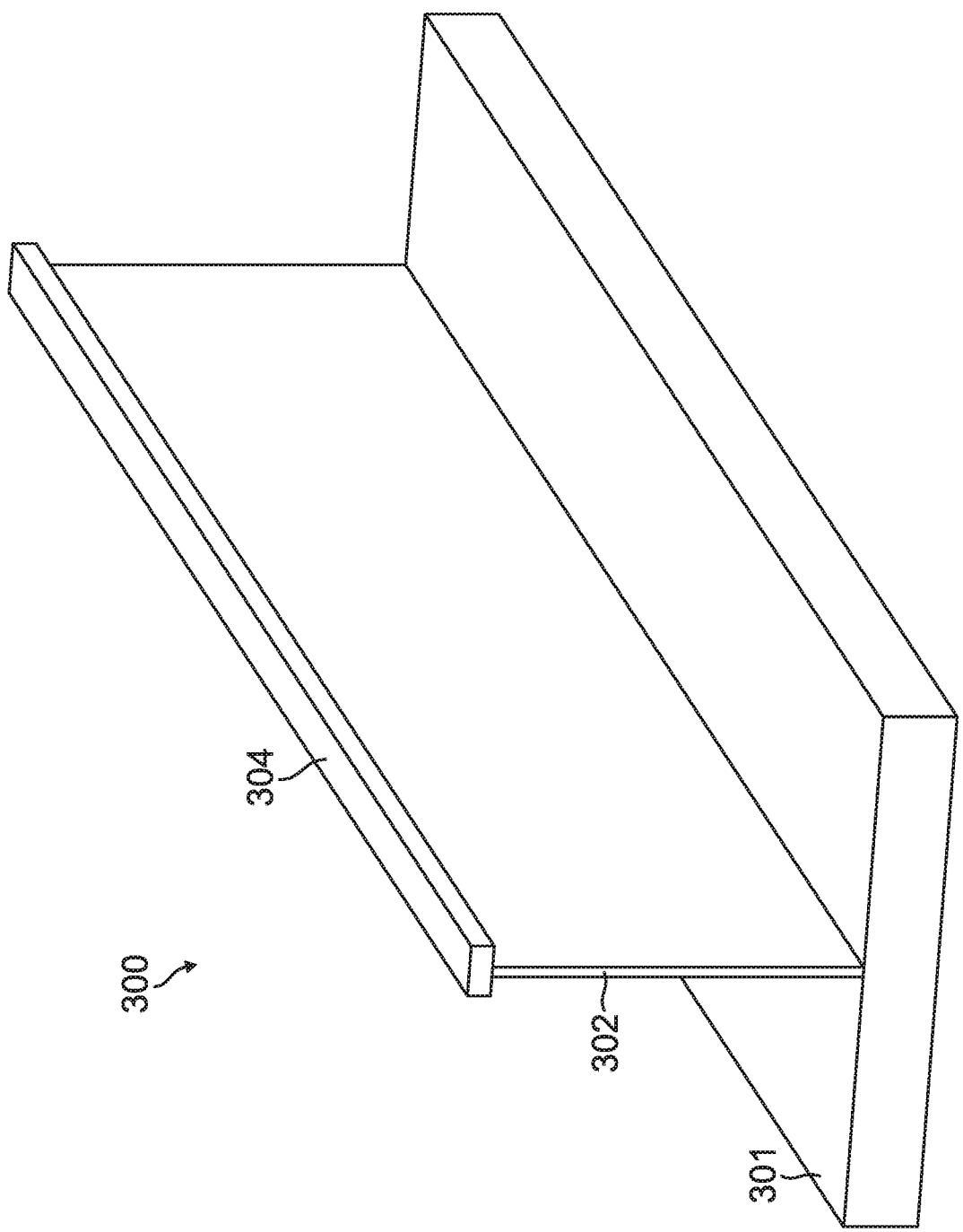
FIG. 3 is a diagram illustrating a waveguide structure that can be used for detecting magnetic fields.

FIG. 3 is a diagram illustrating a waveguide structure 300 that can be used within a system for detecting magnetic fields. In the example shown in FIG. 3, the waveguide structure 300 includes a substrate 301, a nanoscale fin 302, and a waveguide 304. In some examples, the waveguide structure 300 includes a cladding material (not shown) that fills in the empty space between the substrate 301, nanoscale fin 302, and the waveguide 304 shown in FIG. 3.

In some examples, the substrate 301 and the nanoscale fin 302 are formed from the first material described above. For example, the nanoscale fin 302 may be formed in a NV diamond substrate or other similar material using the techniques described below. In some examples, the waveguide 304 is formed from a second material different than the first material. The waveguide 304 is transparent at the pump and probe wavelengths and has a sufficiently high refractive index such that it supports the pump and probe optical modes. In examples where the first material is NV diamond, the second material is transparent at the pump wavelength (532 nm) and the probe wavelength (1042 nm) discussed above. In such examples, the refractive index of the second material should be greater than or equal to 2, and the refractive index would preferably be approximately 2.4 or higher. In some examples, the second material is titanium dioxide, silicon nitride, or another material that satisfies the parameters described above.

The nanoscale fin 302 serves multiple purposes for the waveguide structure 300. The nanoscale fin 302 is used to separate the optical modes propagating in the waveguide 304 from the substrate 301. If the optical modes (pump mode and probe mode) get too close to the substrate 301, it is likely that the light will radiate downward through the nanoscale fin 302 to the substrate 301. To provide sufficient separation between the optical modes and the substrate 301, the height of the nanoscale fin 302 must be above a threshold height. In some examples, the height of the nanoscale fin 302 is approximately 3 microns or greater.

Further, the nanoscale fin 302 is where the absorption of the pump laser light and the probe laser light described above with respect to FIG. 1 occurs in the waveguide structure 300. In some examples, the waveguide 304 is positioned proximate to the top surface of the nanoscale fin 302 such that light propagating through the waveguide 304 is coupled into the nanoscale fin 302 from evanescent wave overlap. For example, light from a pump laser may be coupled into the waveguide 304 and the pump laser light is coupled from the waveguide 304 into the nanoscale fin 302 from evanescent wave overlap. In some examples, the pump laser is configured to emit light at the frequency of the pump laser described above. For example, when the nanoscale fin 302 is formed from NV diamond, the pump laser may be a laser configured to emit light having a wavelength of 532 nm. Accordingly, as the pump laser light is coupled from the waveguide 304 into the nanoscale fin 302 from evanescent wave overlap, the pump laser light may cause the point defects within the nanoscale fin 302 to transition to excited triplet states.

In some examples, light from a probe laser is coupled from a laser source into the waveguide 304. The probe laser may emit light having a wavelength that is absorbed by point defects in the shelved states within the first material. For example, when the nanoscale fin 302 is fabricated from NV diamond, the light from the probe laser can have a wavelength of 1042 nm.

When the waveguide structure 300 is exposed to a signal having the resonant frequency of the first material, the pump laser light, coupled into the waveguide 304 and gradually coupled into the nanoscale fin 302 from evanescent wave overlap, may cause the point defects within the nanoscale fin 302 to move to the shelved states. As the pump laser light is gradually coupled into the nanoscale fin 302 along the coupling length between the nanoscale fin 302 and the waveguide 304, the point defects may absorb the probe laser light along the coupling length in the presence of a signal having the resonant frequency of the first material. Additionally, as the resonance frequency of the first material changes when exposed to a magnetic field, the frequency of the applied signal may be varied to identify frequencies at which the probe laser light is absorbed by the point defects within the nanoscale fin 302. The different identified frequencies may be identified to determine the magnitude and direction of the magnetic field as described above.

While the waveguide 304 appears uniform in FIG. 3, it should be understood that this is for ease of illustration. In some examples, the physical characteristics of the waveguide 304 (for example, width) and the relationship between the waveguide 304 and the substrate 301 and/or the nanoscale fin 302 can be modified such that the pump laser light is gradually coupled from the waveguide 304 into the nanoscale fin 302 from evanescent wave overlap. In some examples, the width of the waveguide 304 is varied such that the pump laser light is gradually coupled into the nanoscale fin 302 along a coupling length through which the nanoscale fin 302 and the waveguide 304 are proximate to one another. In some examples, the physical relationship between the waveguide 304 and the substrate 301 and nanoscale fin 302 is varied such that the pump laser light is gradually coupled into the nanoscale fin 302 along a coupling length through which the nanoscale fin 302 and the waveguide 304 are proximate to one another. Further, in some examples, the pump laser light is substantially coupled into the nanoscale fin 302 such that the pump laser no longer propagates within the waveguide 304 after the coupling length of the nanoscale fin 302 and the waveguide 304. By gradually coupling the pump laser light from the waveguide 304 into the nanoscale fin 302 from evanescent wave overlap, the amount of point defects in the nanoscale fin 302 that transition to the excited triplet states increases.

The use of the waveguide structure 300 as discussed with respect to FIG. 3 increases the interaction length of light within a first material. As discussed above, the pump laser light and the probe laser light are both propagating in the waveguide. Using the nanoscale fin 302 and waveguide 304, the pump laser light may be slowly coupled into the nanoscale fin 302 from evanescent wave overlap. In particular, the pump laser light is absorbed at a faster rate by the first material than the absorption of the probe laser light by the first material.

By slowly leaking the pump laser into the nanoscale fin 302, the waveguide structure 300 may provide increased absorption of the probe laser light, leading to greater contrast along with efficient absorption of the pump laser along the coupling length between the nanoscale fin 302 and the waveguide 304. As described below, light may be slowly coupled from the waveguide 304 to the nanoscale fin 302 in such a way that the pump laser light has a substantially constant intensity throughout the coupling length of the nanoscale fin 302.

Figure 4A:
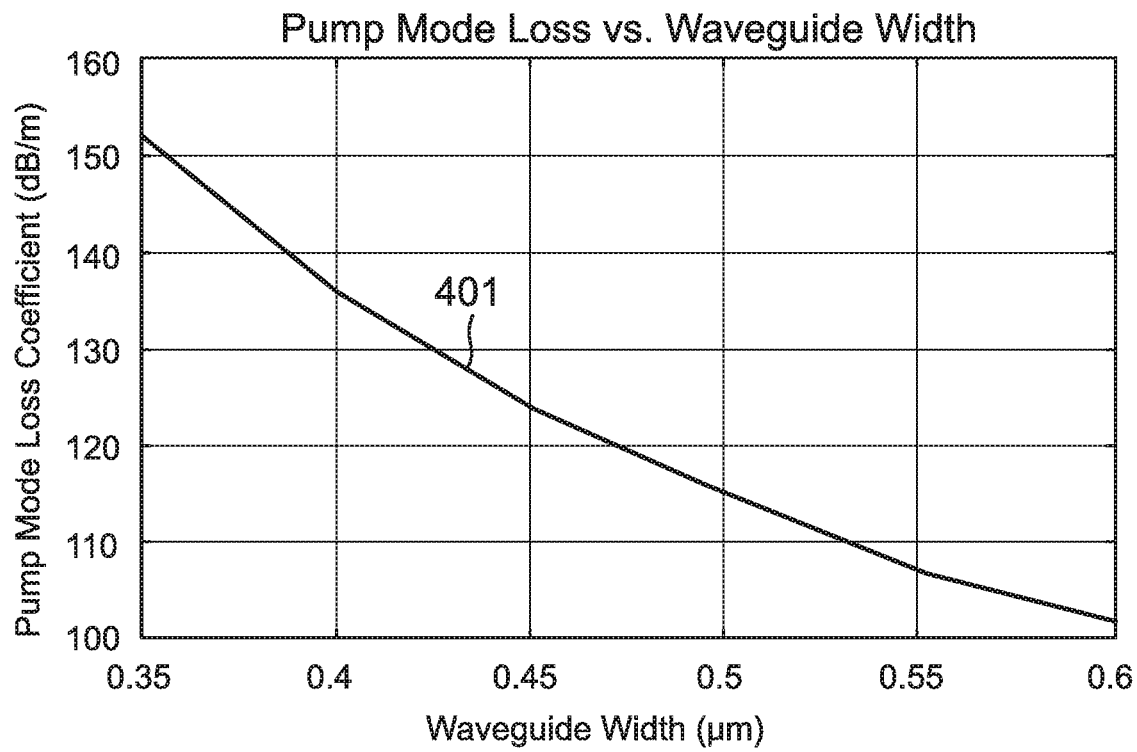
FIG. 4A-4B are graphs illustrating the effects of different waveguide widths in a waveguide structure for detecting magnetic fields.
Figure 4B:
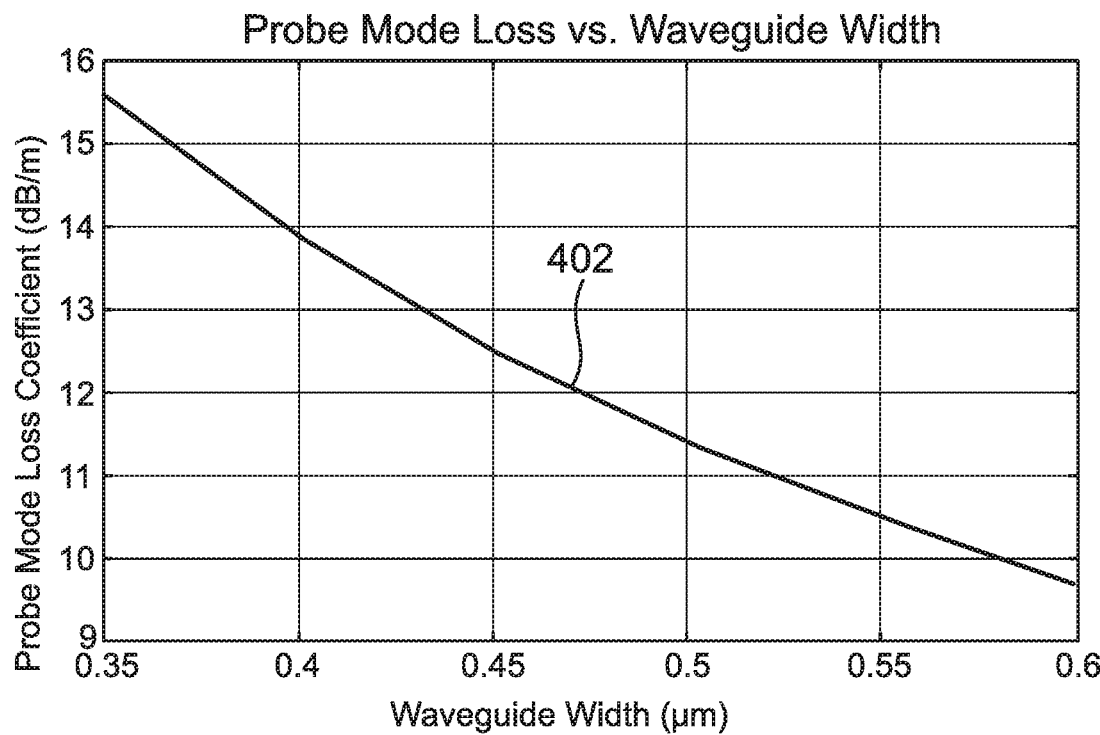

FIGS. 4A-4B are graphs illustrating the effects of different widths of the waveguide in a waveguide structure, such as waveguide structure 300 in FIG. 3, for detecting magnetic fields. In FIG. 4A, the various coupling coefficients for the pump mode propagating in a waveguide made from the second material having different widths are shown. For example, graph 401 illustrates the pump mode coupling coefficients for the waveguide and the nanoscale fin over various widths of the waveguide of the waveguide structure. In FIG. 4B, the various coupling coefficients for the probe mode propagating in a waveguide 304 made from the second material having different widths are shown. For example, graph 402 illustrates the probe mode coupling coefficients for the waveguide and the nanoscale fin over various widths of the waveguide of the waveguide structure. As can be seen from FIGS. 4A-4B, the general trend of the pump mode coupling coefficients vs. waveguide width is similar to the general trend of the probe mode coupling coefficients vs. waveguide width.

Figure 5A:
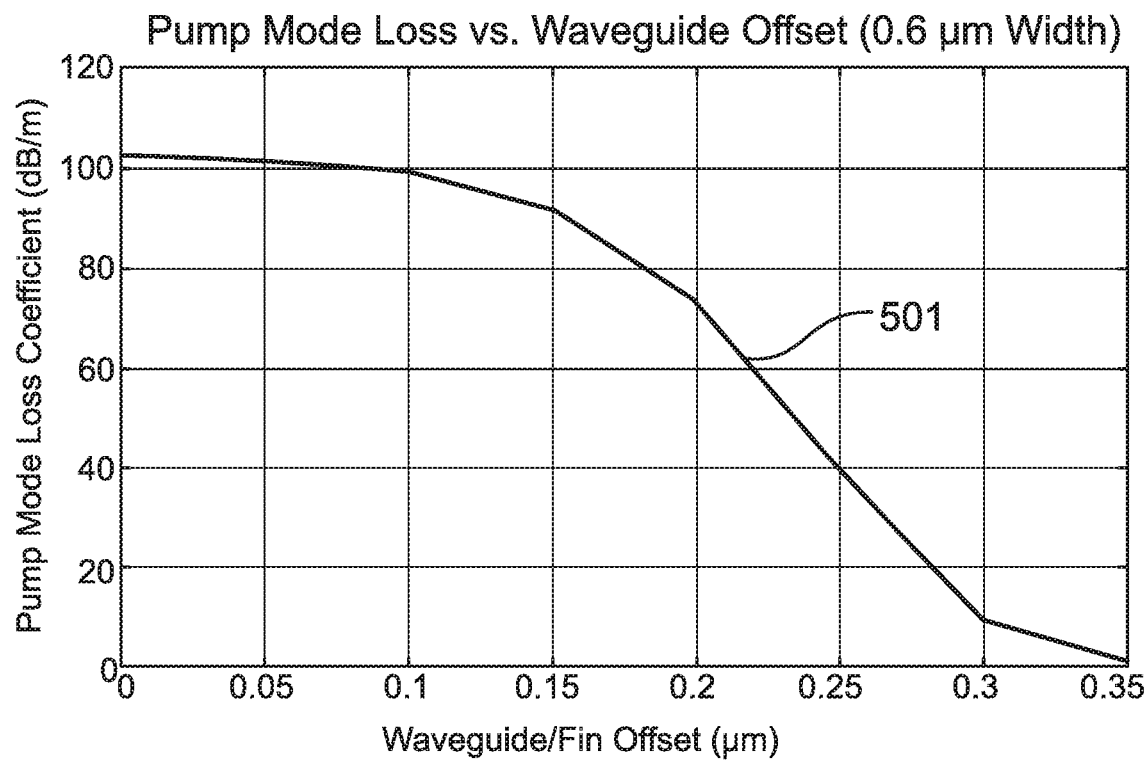
FIGS. 5A-5B are graphs illustrating the effects of different separation distances between the waveguide and substrate in a waveguide structure for detecting magnetic fields.

FIG. 5A is a graph illustrating the effects of different separation distances between the substrate and the waveguide in a waveguide structure, such as waveguide structure 300 in FIG. 3, for detecting magnetic fields. In FIG. 5A, the various coupling coefficients for the pump mode propagating in a 0.6 µm width waveguide 304 made from the second material and separated from the substrate by various distances are shown. For example, graph 501 illustrates the pump mode coupling coefficients for the waveguide and the nanoscale fin over various separation distances between the substrate and the waveguide of the waveguide structure.

Figure 5B:
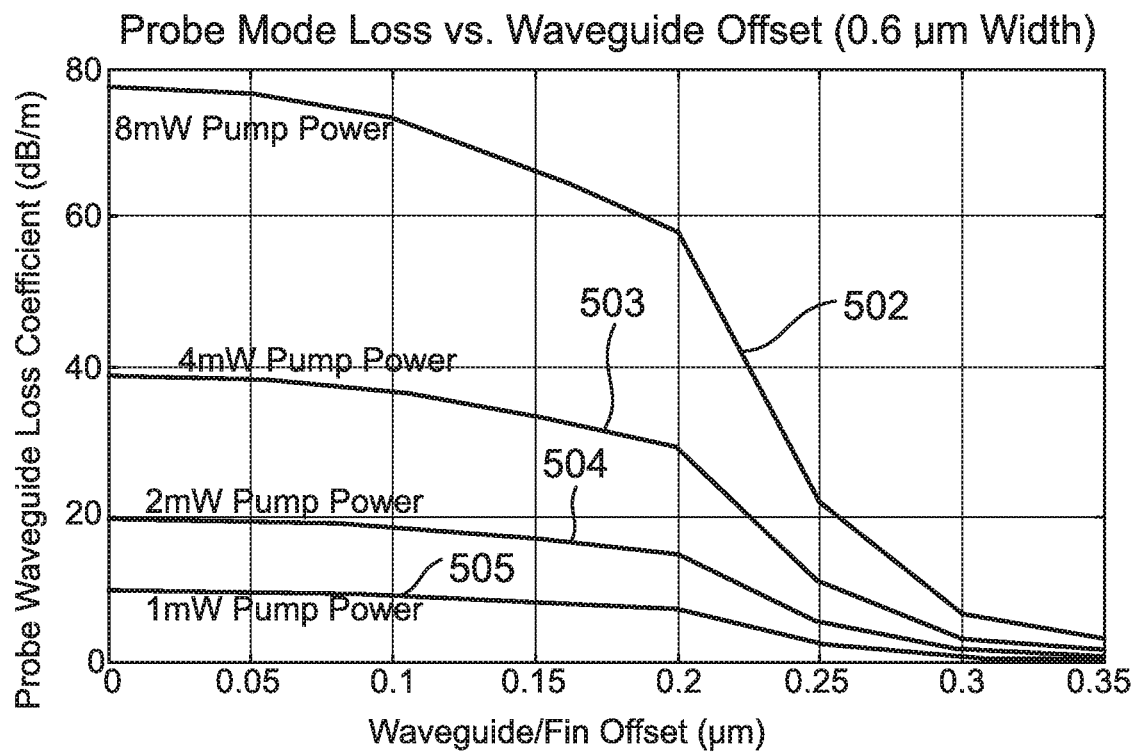

FIG. 5B is a graph illustrating the effects of different separation distances between the substrate and the waveguide in a waveguide structure, such as waveguide structure 300 in FIG. 3, for detecting magnetic fields. In FIG. 5B, the various coupling coefficients for the probe mode propagating in a 0.6 µm width waveguide 304 made from the second material and separated from the substrate by various distances are shown for various pump powers. For example, graph 502 illustrates the probe mode coupling coefficients for the waveguide and the nanoscale fin where the pump power is 8 mW, graph 503 illustrates the probe mode coupling coefficients for the waveguide and the nanoscale fin where the pump power is 4 mW, graph 504 illustrates the probe mode coupling coefficients for the waveguide and the nanoscale fin where the pump power is 2 mW, and graph 505 illustrates the probe mode coupling coefficients for the waveguide and the nanoscale fin where the pump power is 1 mW. As can be seen from FIGS. 5A-5B, the general trend of the pump mode coupling coefficients vs. separation distance is similar to the general trend of the probe mode coupling coefficients vs. separation distance.

As shown in FIGS. 4A-5B, the rate that light is coupled from the waveguide 304 into the nanoscale fin 302 along the coupling length of the waveguide structure 300 is dependent on both the lateral width of the waveguide 304 and the vertical distance between the substrate and the waveguide 304 (height of the nanoscale fin). Accordingly, to control the rate at which light is coupled from the waveguide 304 into the nanoscale fin 302 along the coupling length of the waveguide structure, the width of the waveguide 304 and/or the distance between the substrate 301 and the waveguide 304 (height of the nanoscale fine 302) may be varied along the coupling length.

Figure 6A:
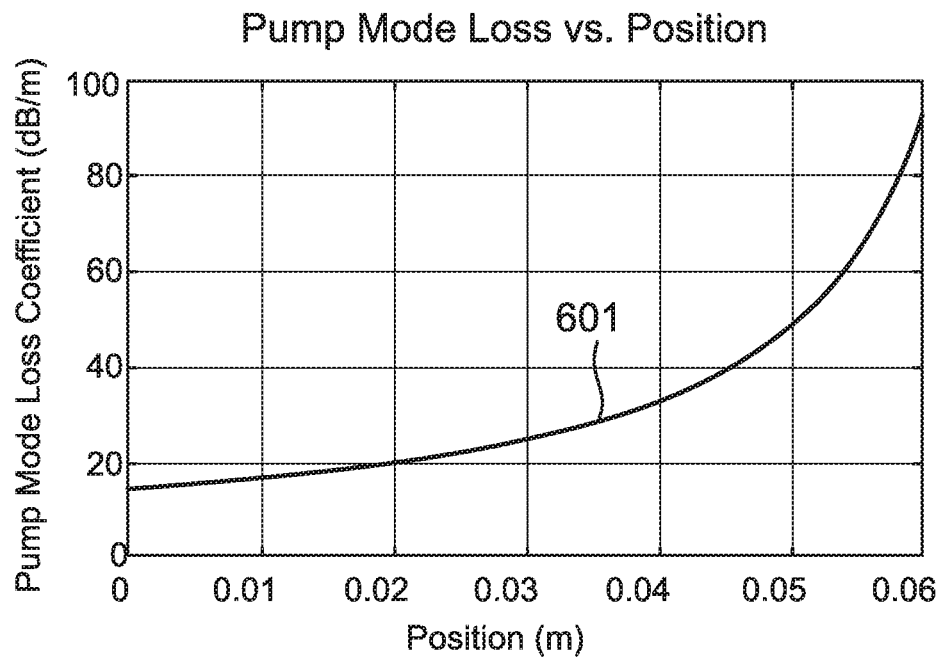
FIGS. 6A-6C are graphs illustrating the effects of position along the coupling length of the waveguide in a waveguide structure for detecting magnetic fields.
Figure 6B:
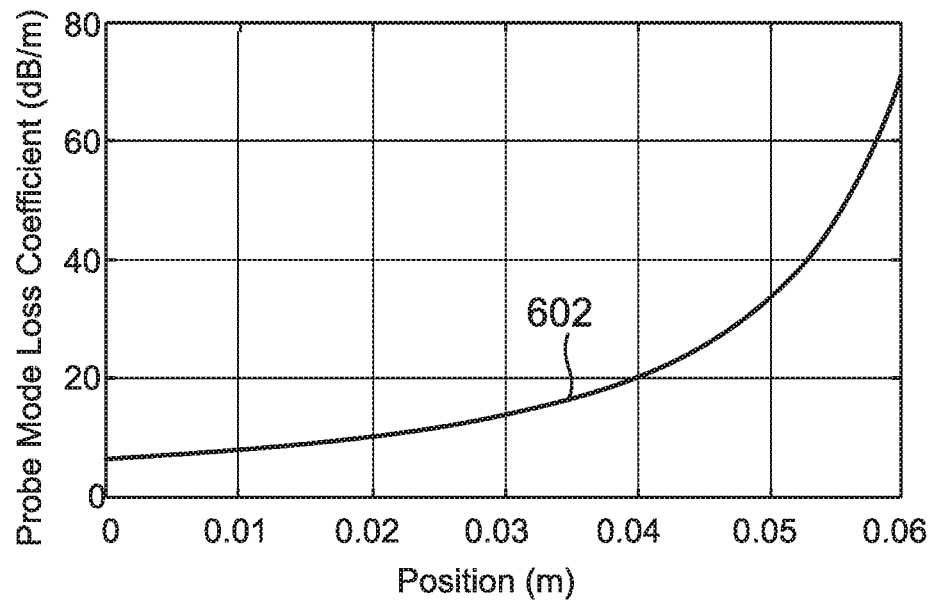
Figure 6C:
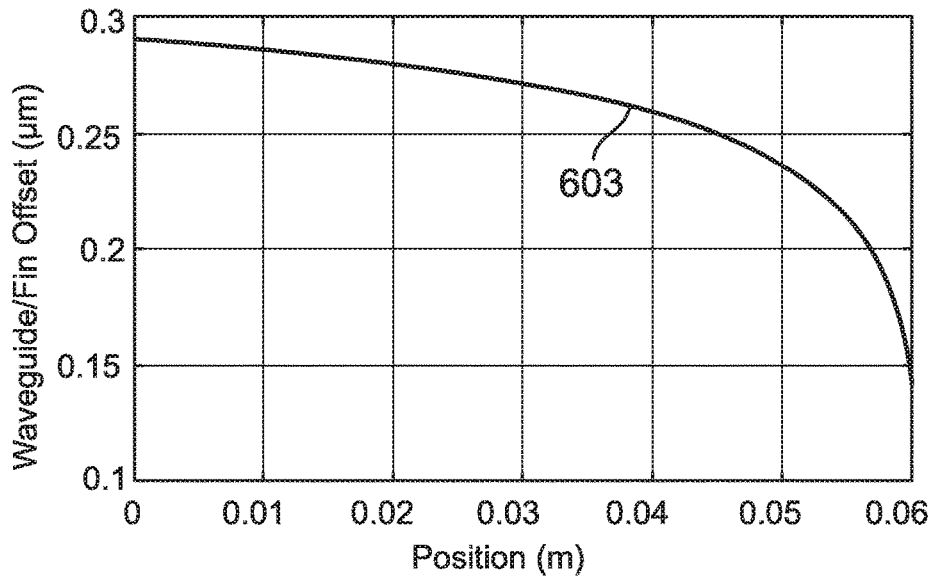

FIGS. 6A-6C are graphs illustrating the effects of different positions along the coupling length of the waveguide in a waveguide structure, such as waveguide structure 300 in FIG. 3, for detecting magnetic fields. In FIG. 6A, the various coupling coefficients for the pump mode propagating in a waveguide 304 made from the second material at various positions along the coupling length of the waveguide are shown. For example, graph 601 illustrates the pump mode coupling coefficients for the waveguide and the nanoscale fin over the coupling length of the waveguide of the waveguide structure. In FIG. 6B, the various coupling coefficients for the probe mode propagating in a waveguide 304 made from the second material at various positions along the coupling length of the waveguide are shown. For example, graph 602 illustrates the probe mode coupling coefficients for the waveguide and the nanoscale fin over the coupling length of the waveguide of the waveguide structure where the pump power is 8 mW.

FIG. 6C is a graph illustrating the variation of the distance between the substrate 301 and the waveguide 304 along the coupling length of the waveguide 304 such that the pump absorption by the nanoscale fin is uniform. For example, graph 603 illustrates that the separation distance between the substrate 301 and the waveguide 304 is decreased along the coupling length of the waveguide 304 such that the absorption of the pump laser light in the nanoscale fin is uniform.

Figure 7:
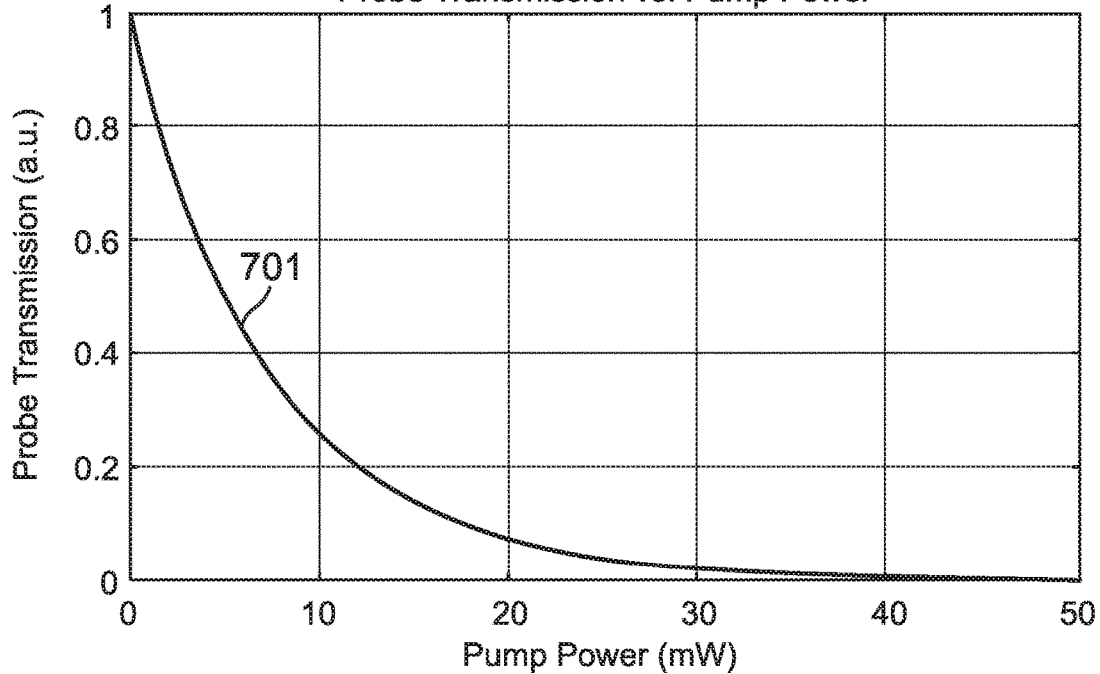
FIG. 7 is a graph illustrating the effects of pump power on probe transmission from a waveguide in a waveguide structure for detecting magnetic fields.

FIG. 7 is a graph illustrating the effects of pump power on probe transmission from a waveguide in a waveguide structure, such as waveguide structure 300 in FIG. 3, for detecting magnetic fields. In FIG. 7, graph 701 illustrates the that probe transmission decreases as the pump power increases.

Figure 8:
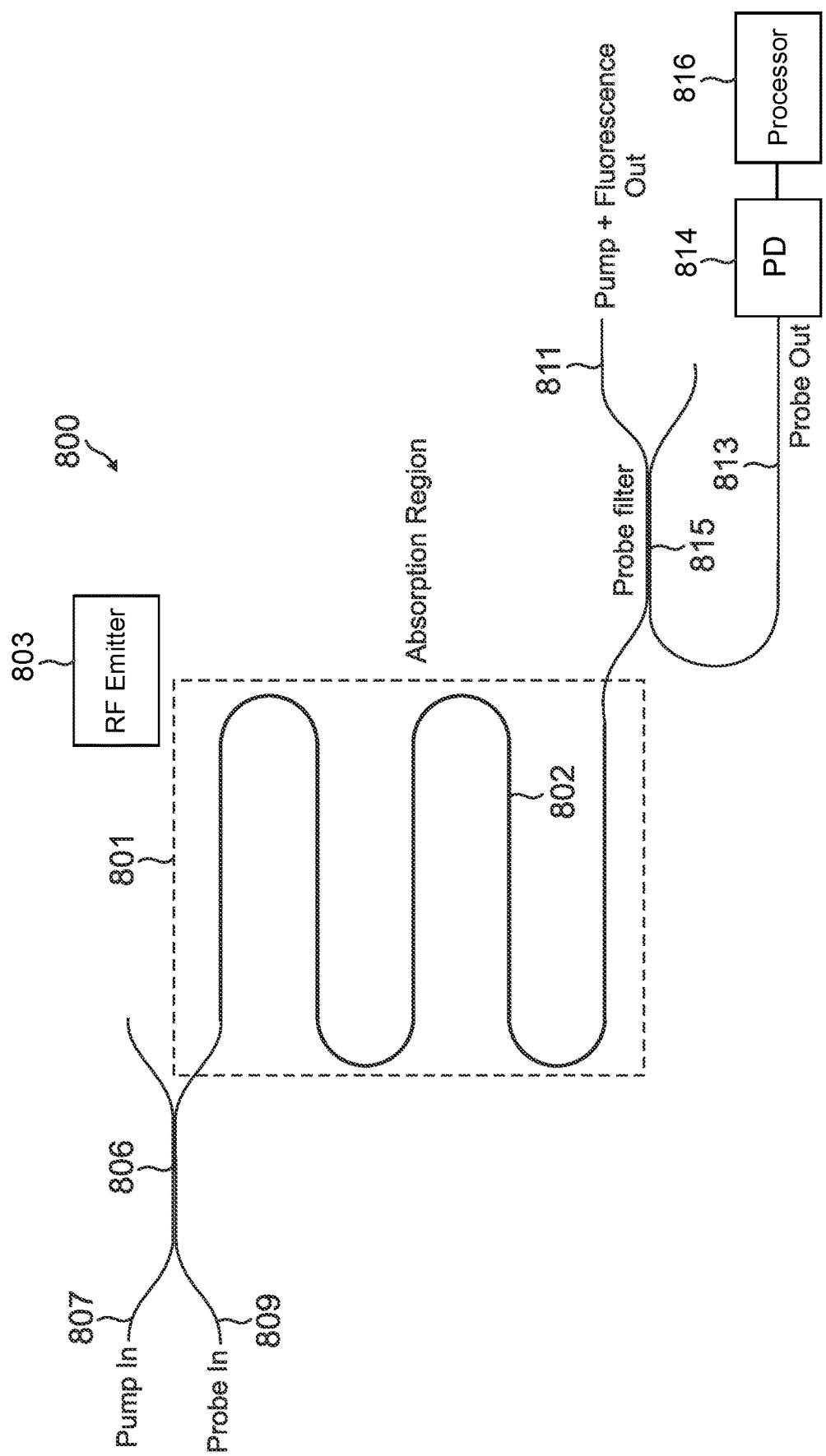
FIG. 8 is a diagram of a waveguide system used for detecting magnetic fields.

FIG. 8 is a diagram of a waveguide system 800 that may be used for detecting magnetic fields. In the example shown in FIG. 8, the waveguide system 800 includes a waveguide structure 802 that includes similar features as described above with respect to the waveguide structure 300 described above with respect to FIG. 3. In some examples, the waveguide system 800 includes an absorption region 801. As used herein, the absorption region 801 may refer to a region within the waveguide system 800 where the nanoscale fin and waveguide of the waveguide structure 802 extend proximate to one another through a coupling length such that pump laser light 807 and the probe laser light 809, introduced into the waveguide from a pump laser source and a probe laser source, respectively, are coupled into the nanoscale fin from evanescent wave overlap as described above.

In some examples, the pump laser light 807 and the probe laser light 809 are coupled into the waveguide 802 via a bichromatic directional coupler 806. In the presence of a resonant frequency signal, the probe laser light 809 may be absorbed by the point defects within the nanoscale fin such that the light received from the waveguide has a decrease in power. To monitor the power of the probe laser light 809 within the waveguide, the waveguide system 800 includes a filter 815. In some examples, the filter 815 is coupled to the waveguide structure 802 and configured to receive light from the waveguide after the light has passed through the absorption region 801. In some examples, the filter 815 is configured to reflect the light at the frequency of the probe laser light 809 through a reflection port 813 and to allow light at other frequencies (for example, frequency of the pump laser light 807 and the fluorescence frequencies) to pass through to a filter output port 811. The remaining pump laser light 807, if any, passes through the filter outlet port 811 after leaving the absorption region 801. In some examples, the power of the pump laser light 807 at the filter outlet port 811 may be substantially at or near zero as most of the pump laser light 807 may be coupled into the nanoscale fin in the absorption region 801.

In some examples, the light at the reflection port 813 is coupled to a photodetection device 814 (for example, a photodetector or camera), which is configured to monitor the intensity of the received light. During operation, microwave radiation may be emitted around the absorption region 801 by an RF emitter 803, where the microwave radiation is swept through a range of frequencies that includes possible resonant frequencies for the first material. The photodetection device 814 may monitor the light received from the reflection port 813 and provide a signal associated with the intensity of the received light. In some examples, a processor 816 is configured to receive the signal from the photodetection device 814 and associate the intensity of the received light with the frequency of the microwave radiation applied to the absorption region 801 when the received light intensity was measured. In some examples, the processor 816 is configured to execute computer-executable instructions that identify the applied frequencies associated with decreases in light intensity. In some examples, the processor 816 may determine that the identified frequencies are resonant frequencies and calculate a magnitude and direction of magnetic fields applied to the absorption region 801.

Figure 9:
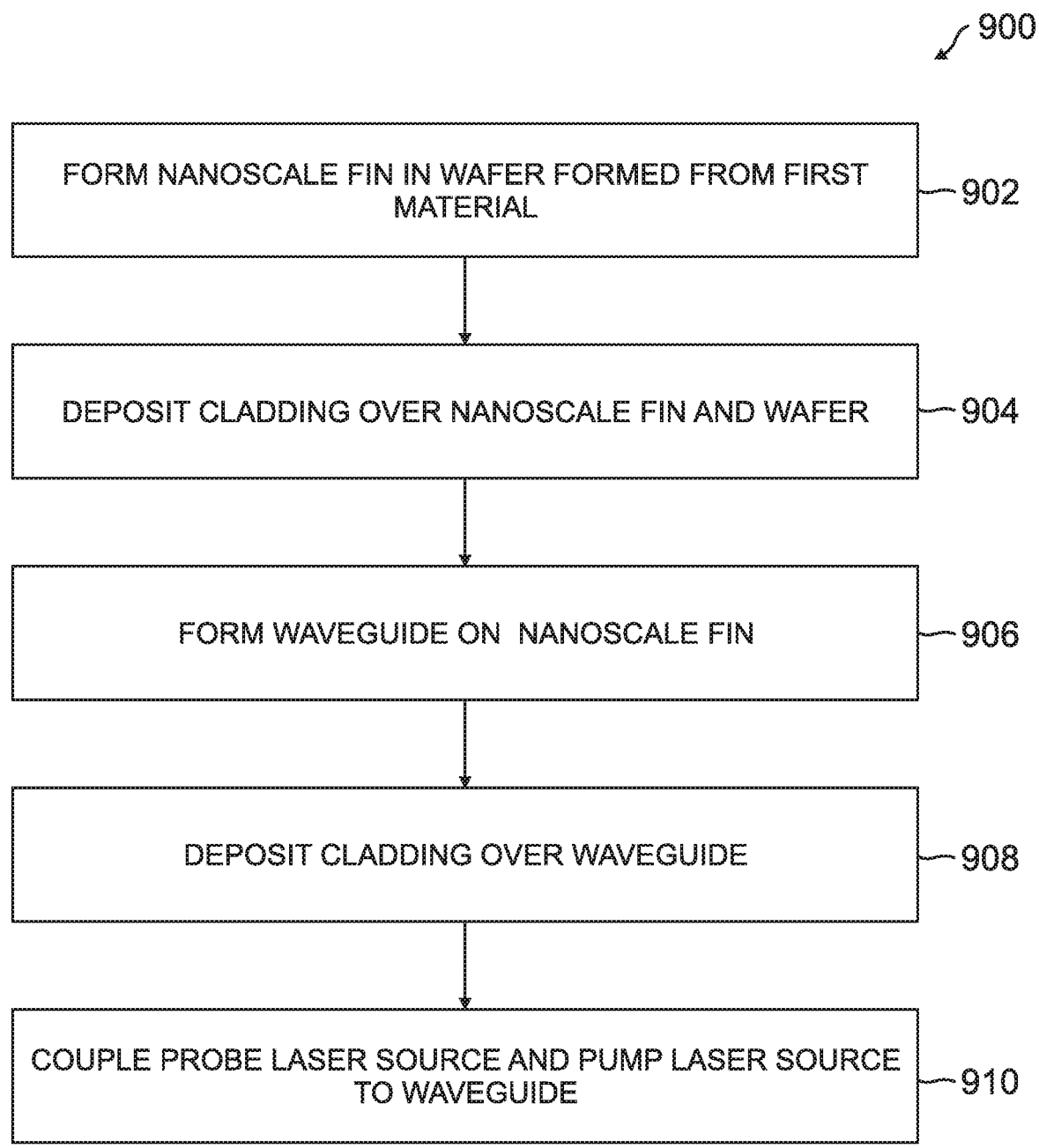
FIG. 9 is a flowchart diagram of an example method for fabricating a waveguide structure for detecting magnetic fields.

FIG. 9 illustrates an example method 900 for fabricating the waveguide structure for detecting magnetic fields. The method begins with forming a nanoscale fin in a wafer formed from a first material (block 902). In some examples, a first material may be nitrogen vacancy (NV) diamond, silicon carbide, or other material having similar physical characteristics. As used herein, NV diamond may refer to a diamond material having multiple point defects where a point defect includes a nearest-neighbor pair of a nitrogen atom substituted for a carbon atom and a lattice vacancy.

In some examples, forming the nanoscale fin in the wafer includes etching the wafer using reactive ion etching, for example. In such examples, the wafer can be prepared for etching using lithography techniques. In some examples, the wafer is prepared by depositing a photoresist layer on the wafer, patterning the photoresist layer using lithography (for example, e-beam lithography or UV lithography), and developing the photoresist layer. Once nanoscale fin is sufficiently formed after the reactive ion etching, any remaining photoresist is removed.

The method 900 proceeds with depositing a cladding material over the nanoscale fin (block 904). In some examples, the cladding material has a low index of refraction (for example, silicon dioxide) compared to the wafer. In some examples, the cladding material is deposited using chemical vapor deposition or atomic layer deposition. In some examples, the cladding material is polished using chemical mechanical polishing to prepare the cladding material for further fabrication steps. In some examples, the cladding material is polished until a top surface of the nanoscale fin is exposed.

The method 900 proceeds with forming a waveguide on the nanoscale fin (block 906). In some examples, the waveguide is formed from a second material that is different from the first material. The waveguide is transparent at the pump and probe wavelengths and has a sufficiently high refractive index such that it supports the pump and probe optical modes. In examples where the first material is NV diamond, the second material is transparent at the pump wavelength (532 nm) and the probe wavelength (1042 nm) discussed above. In such examples, the refractive index of the second material should be greater than or equal to 2, and the refractive index would preferably be approximately 2.4 or higher. In some examples, the second material is titanium dioxide, silicon nitride, or another material that satisfies the parameters described above.

In some examples, forming the waveguide includes using reactive ion etching, for example. In such examples, the waveguide material can be prepared for etching using lithography techniques. In some examples, the waveguide material is prepared by depositing a photoresist layer on the layer of waveguide material, patterning the photoresist layer using lithography (for example, e-beam lithography or UV lithography), and developing the photoresist layer. In some examples, the photoresist layer is removed after the reactive ion etching.

The method 900 proceeds with depositing cladding material over the waveguide (block 908) in a manner similar to that described above with respect to block 904.

In some examples, the method 900 proceeds with coupling a probe laser source and a pump laser source to the waveguide (block 910). For example, the probe laser source may be coupled to the waveguide and configured to emit a probe laser into the waveguide and the pump laser source may be coupled to the waveguide and configured to emit a pump laser into the waveguide at a wavelength that causes the first material to absorb the probe laser when the nanoscale fin is exposed to one or more resonant frequencies for the first material. In some examples, the probe laser source and the pump laser source are coupled to the waveguide using optical fibers and a bichromatic directional coupler. In such examples, the probe laser source and the pump laser source are coupled to respective optical fibers, which are then coupled to the bichromatic directional coupler. The light from the probe laser source and the pump laser source is oscillated using the bichromatic directional coupler such that substantially all of the light from the probe laser source and the pump laser source is coupled into the waveguide.

Figure 10:
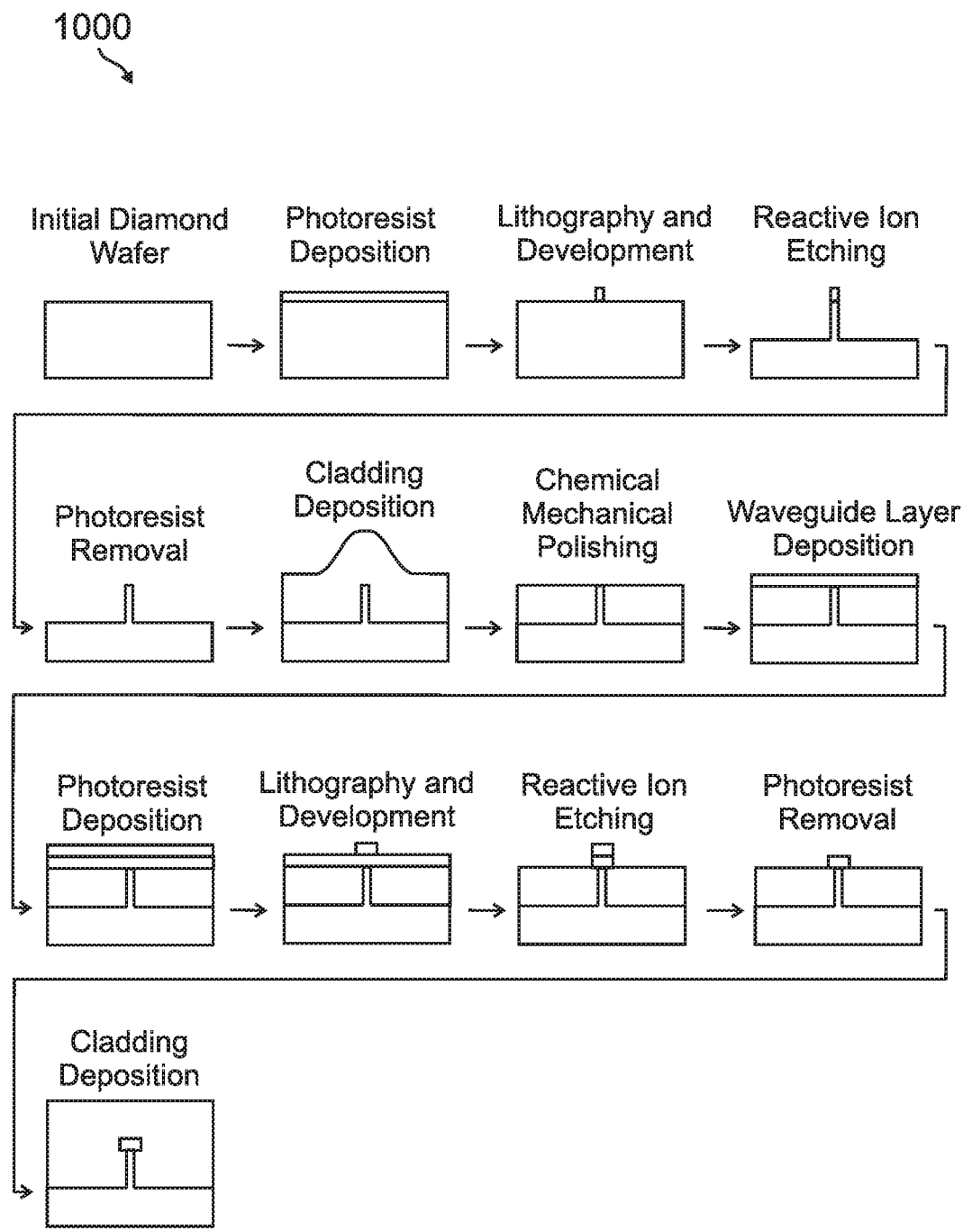
FIG. 10 is a flowchart diagram of an example method for fabricating a waveguide structure for detecting magnetic fields.

FIG. 10 illustrates an example method 1000 for fabricating the waveguide structure for detecting magnetic fields and depicts cross-sections of the waveguide structure during the various steps of the method 1000.

In various aspects, system elements, method steps, or examples described throughout this disclosure (such as the processor, for example) may be implemented on one or more computer systems, field programmable gate array (FPGA), application specific integrated circuit (ASIC) or similar devices comprising hardware executing code to realize those elements, processes, or examples, said code stored on a non-transient data storage device. These devices include or function with software programs, firmware, or other computer readable instructions for carrying out various methods, process tasks, calculations, and control functions, used for synchronization and fault management in a distributed antenna system.

These instructions are typically stored on any appropriate computer readable medium used for storage of computer readable instructions or data structures. The computer readable medium can be implemented as any available media that can be accessed by a general purpose or special purpose computer or processor, or any programmable logic device. Suitable processor-readable media may include storage or memory media such as magnetic or optical media. For example, storage or memory media may include conventional hard disks, Compact Disk-Read Only Memory (CD-ROM), volatile or non-volatile media such as Random Access Memory (RAM) (including, but not limited to, Synchronous Dynamic Random Access Memory (SDRAM), Double Data Rate (DDR) RAM, RAMBUS Dynamic RAM (RDRAM), Static RAM (SRAM), etc.), Read Only Memory (ROM), Electrically Erasable Programmable ROM (EEPROM), and flash memory, etc. Suitable processor-readable media may also include transmission media such as electrical, electromagnetic, or digital signals, conveyed via a communication medium such as a network and/or a wireless link.

The methods and techniques described here may be implemented in digital electronic circuitry, or with a programmable processor (for example, a special-purpose processor or a general-purpose processor such as a computer) firmware, software, or in combinations of them. Apparatus embodying these techniques may include appropriate input and output devices, a programmable processor, and a storage medium tangibly embodying program instructions for execution by the programmable processor. A process embodying these techniques may be performed by a programmable processor executing a program of instructions to perform desired functions by operating on input data and generating appropriate output. The techniques may advantageously be implemented in one or more programs that are executable on a programmable system including at least one programmable processor coupled to receive data and instructions from, and to transmit data and instructions to, a data storage system, at least one input device, and at least one output device. Generally, a processor will receive instructions and data from a read-only memory and/or a random-access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and DVD disks. Any of the foregoing may be supplemented by, or incorporated in, specially-designed application-specific integrated circuits (ASICs).

EXAMPLE EMBODIMENTS

Example 1 includes a device comprising: a substrate and a nanoscale fin formed from a first material; a radio frequency emitter configured to emit energy in a range of radio frequencies; a waveguide formed from a second material; a bichromatic directional coupler configured to couple pump laser light and probe laser light into the waveguide, wherein the waveguide is positioned proximate to the nanoscale fin along a coupling length such that the pump laser light propagating within the waveguide is coupled into the nanoscale fin from evanescent wave overlap along the coupling length, wherein the pump laser light causes the first material to absorb the probe laser light when the energy emitted by the radio frequency emitter is at one or more frequencies that depend on a magnetic field; and a processor configured to determine a magnetic field strength based on an identification of the one or more frequencies that depend on the magnetic field.

Example 2 includes the device of Example 1, wherein the first material comprises nitrogen vacancy diamond.

Example 3 includes the device of any of Examples 1-2, wherein the second material comprises titanium dioxide.

Example 4 includes the device of any of Examples 1-3, wherein a height of the nanoscale fin is greater than or equal to approximately 3 microns.

Example 5 includes the device of any of Examples 1-4, wherein a height of the nanoscale fin varies over the coupling length.

Example 6 includes the device of any of Examples 1-5, wherein a height of the nanoscale fin increases over the coupling length.

Example 7 includes the device of any of Examples 1-6, wherein a width of the waveguide varies over the coupling length.

Example 8 includes a system comprising: a substrate and a nanoscale fin formed from a first material; a radio frequency emitter configured to emit energy in a range of radio frequencies; a waveguide formed from a second material; a pump laser source configured to generate the pump laser light; a probe laser source configured to generate the probe laser light; a bichromatic directional coupler coupled to the pump laser source and the probe laser source, wherein the bichromatic directional coupler is configured to couple the pump laser light and the probe laser light into the waveguide, wherein the waveguide is positioned proximate to the nanoscale fin along a coupling length such that the pump laser light propagating within the waveguide is coupled into the nanoscale fin from evanescent wave overlap along the coupling length, wherein the pump laser light causes the first material to absorb the probe laser light when the energy embittered by the radio frequency emitter is at one or more frequencies that depend on a magnetic field; and a processor configured to determine a magnetic field strength based on an identification of the one or more frequencies that depend on the magnetic field.

Example 9 includes the system of Example 8, wherein the first material comprises nitrogen vacancy diamond.

Example 10 includes the system of any of Examples 8-9, wherein the second material comprises titanium dioxide.

Example 11 includes the system of any of Examples 8-10, wherein a height of the nanoscale fin is greater than or equal to approximately 3 microns.

Example 12 includes the system of any of Examples 8-11, wherein a height of the nanoscale fin varies over the coupling length.

Example 13 includes the system of any of Examples 8-12, wherein a height of the nanoscale fin increases over the coupling length.

Example 14 includes the system of any of Examples 8-13, wherein a width of the waveguide varies over the coupling length.

Example 15 includes the system of any of Examples 8-14, further comprising a filter coupled to the waveguide, wherein the filter is configured to output the probe laser light at a first output port of the filter and to output the pump laser light and fluorescence at a second output port of the filter.

Example 16 includes the system of Example 15, further comprising a photodetection device coupled to the first output port of the filter and the processor, wherein the photodetection device is configured to monitor intensity of the probe laser light received from the filter and provide a signal associated with the intensity of the probe laser light to the processor.

Example 17 includes a method comprising: forming a nanoscale fin in a substrate of a first material; depositing a cladding material on the nanoscale fin and the substrate; forming a waveguide from a second material, wherein the waveguide is positioned proximate to a top surface of the nanoscale fin along a coupling length such that light propagating within the waveguide is coupled into the nanoscale fin from evanescent wave overlap along the coupling length; depositing the cladding material on the waveguide; coupling a probe laser source to the waveguide, wherein the probe laser source is configured to emit probe laser light into the waveguide; and coupling a pump laser source to the waveguide, wherein the pump laser source is configured to emit pump laser light into the waveguide at a wavelength that causes the first material to absorb the probe laser light when the waveguide layer is exposed to one or more resonant frequencies for the first material.

Example 18 includes the method of Example 17, wherein the first material comprises nitrogen vacancy diamond.

Example 19 includes the method of any of Examples 17-18, wherein the second material comprises titanium dioxide.

Example 20 includes the method of any of Examples 17-19, wherein a height of the nanoscale fin is greater than or equal to approximately 3 microns.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A device comprising:
   a substrate and a nanoscale fin formed from a first material;
   a radio frequency emitter configured to emit energy in a range of radio frequencies;
   a waveguide formed from a second material;
   a bichromatic directional coupler configured to couple pump laser light and probe laser light into the waveguide, wherein the waveguide is positioned proximate to the nanoscale fin along a coupling length such that the pump laser light propagating within the waveguide is coupled into the nanoscale fin from evanescent wave overlap along the coupling length, wherein the pump laser light causes the first material to absorb the probe laser light when the energy emitted by the radio frequency emitter is at one or more frequencies that depend on a magnetic field; and
   a processor configured to determine a magnetic field strength based on an identification of the one or more frequencies that depend on the magnetic field.

2. The device of claim 1, wherein the first material comprises nitrogen vacancy diamond.

3. The device of claim 1, wherein the second material comprises titanium dioxide.

4. The device of claim 1, wherein a height of the nanoscale fin from the substrate is greater than or equal to approximately 3 microns.

5. The device of claim 1, wherein a height of the nanoscale fin from the substrate varies over the coupling length.

6. The device of claim 1, wherein a height of the nanoscale fin from the substrate increases over the coupling length.

7. The device of claim 1, wherein a width of the waveguide varies over the coupling length.

8. A system comprising:
   a substrate and a nanoscale fin formed from a first material;
   a radio frequency emitter configured to emit energy in a range of radio frequencies;
   a waveguide formed from a second material;
   a pump laser source configured to generate the pump laser light;
   a probe laser source configured to generate the probe laser light;
   a bichromatic directional coupler coupled to the pump laser source and the probe laser source, wherein the bichromatic directional coupler is configured to couple the pump laser light and the probe laser light into the waveguide, wherein the waveguide is positioned proximate to the nanoscale fin along a coupling length such that the pump laser light propagating within the waveguide is coupled into the nanoscale fin from evanescent wave overlap along the coupling length, wherein the pump laser light causes the first material to absorb the probe laser light when the energy emitted by the radio frequency emitter is at one or more frequencies that depend on a magnetic field; and
   a processor configured to determine a magnetic field strength based on an identification of the one or more frequencies that depend on the magnetic field.

9. The system of claim 8, wherein the first material comprises nitrogen vacancy diamond.

10. The system of claim 8, wherein the second material comprises titanium dioxide.

11. The system of claim 8, wherein a height of the nanoscale fin from the substrate is greater than or equal to approximately 3 microns.

12. The system of claim 8, wherein a height of the nanoscale fin from the substrate varies over the coupling length.

13. The system of claim 8, wherein a height of the nanoscale fin from the substrate increases over the coupling length.

14. The system of claim 8, wherein a width of the waveguide varies over the coupling length.

15. The system of claim 8, further comprising a filter coupled to the waveguide, wherein the filter is configured to output the probe laser light at a first output port of the filter and to output the pump laser light and fluorescence at a second output port of the filter.

16. The system of claim 15, further comprising a photodetection device coupled to the first output port of the filter and the processor, wherein the photodetection device is configured to monitor intensity of the probe laser light received from the filter and provide a signal associated with the intensity of the probe laser light to the processor.

17. A method for determining a magnetic field strength comprising:
    forming a nanoscale fin in a substrate of a first material;
    depositing a cladding material on the nanoscale fin and the substrate;
    forming a waveguide from a second material, wherein the waveguide is positioned proximate to a top surface of the nanoscale fin along a coupling length such that light propagating within the waveguide is coupled into the nanoscale fin from evanescent wave overlap along the coupling length;
    depositing the cladding material on the waveguide;
    coupling a probe laser source to the waveguide, wherein the probe laser source is configured to emit probe laser light into the waveguide; and
    coupling a pump laser source to the waveguide, wherein the pump laser source is configured to emit pump laser light into the waveguide at a wavelength that causes the first material to absorb the probe laser light when the waveguide layer is exposed to one or more resonant frequencies for the first material; and determining the magnetic field strength based on an identification of the one or more resonant frequencies.

18. The method of claim 17, wherein the first material comprises nitrogen vacancy diamond.

19. The method of claim 17, wherein the second material comprises titanium dioxide.

20. The method of claim 17, wherein a height of the nanoscale fin from the substrate is greater than or equal to approximately 3 microns.

* * * * *